(12) United States Patent
Shen

(10) Patent No.: US 8,484,406 B2
(45) Date of Patent: Jul. 9, 2013

(54) METHOD OF EVENLY USING A PLURALITY OF BLOCKS OF A FLASH MEMORY, AND ASSOCIATED MEMORY DEVICE AND CONTROLLER THEREOF

(75) Inventor: Yang-Chih Shen, Taipei (TW)

(73) Assignee: Silicon Motion Inc., Taiyuan St., Jhubei, Hsinchu County (TW)

( * ) Notice: Subject to any disclaimer, the term of this patent is extended or adjusted under 35 U.S.C. 154(b) by 493 days.

(21) Appl. No.: 12/566,637

(22) Filed: Sep. 24, 2009

(65) Prior Publication Data

US 2010/0228907 A1 Sep. 9, 2010

(30) Foreign Application Priority Data

Mar. 3, 2009 (TW) ................................ 98106841 A

(51) Int. Cl.
*G06F 12/00* (2006.01)
(52) U.S. Cl.
USPC .................... 711/103; 711/165; 711/E12.008
(58) Field of Classification Search
None
See application file for complete search history.

(56) References Cited

U.S. PATENT DOCUMENTS

| | | | |
|---|---|---|---|
| 2006/0149896 A1* | 7/2006 | Chang et al. | 711/103 |
| 2006/0203546 A1 | 9/2006 | Lasser | |
| 2008/0279005 A1* | 11/2008 | France | 365/185.11 |
| 2008/0313505 A1* | 12/2008 | Lee et al. | 714/47 |

FOREIGN PATENT DOCUMENTS

| | | |
|---|---|---|
| CN | 1701390 A | 11/2005 |
| CN | 1815629 A | 8/2006 |
| CN | 101409108 A | 4/2009 |

\* cited by examiner

*Primary Examiner* — Reginald Bragdon
*Assistant Examiner* — Arvind Talukdar
(74) *Attorney, Agent, or Firm* — Winston Hsu; Scott Margo

(57) ABSTRACT

A method of evenly using a plurality of blocks of a Flash memory comprises: providing at least one threshold value, which is utilized for sieving out blocks suitable for use from the plurality of blocks according to erase counts of the plurality of blocks; and by comparing erase counts of at least a portion of the plurality of blocks with the threshold value, sieving out a specific block for use from the plurality of blocks according to a purpose of use. An associated memory device and a controller thereof are also provided, where the controller comprises: a ROM arranged to store a program code, wherein the controller is provided with the at least one threshold value through the program code; and a microprocessor arranged to execute the program code to control the access to the Flash memory. The controller sieves out the specific block according to the purpose of use.

32 Claims, 9 Drawing Sheets

| Block identified by block number | Erase count |
|---|---|
| Fblk(0) | 16 |
| Fblk(1) | 6 |
| ⋮ | ⋮ |
| Fblk(11) | 2 |
| ⋮ | ⋮ |
| Fblk(210) | 10 |
| ⋮ | ⋮ |
| Fblk(560) | 5 |
| ⋮ | ⋮ |
| Fblk(790) | 9 |
| ⋮ | ⋮ |

FIG. 3

| Erase count | 1 | 2 | 3 | 3 | 5 | 5 | 5 | 6 | 7 | ... |
|---|---|---|---|---|---|---|---|---|---|---|
| Block identified by block number | Fblk (2) | Fblk (17) | Fblk (300) | Fblk (170) | Fblk (712) | Fblk (44) | Fblk (12) | Fblk (194) | Fblk (602) | |

FIG. 9

METHOD OF EVENLY USING A PLURALITY OF BLOCKS OF A FLASH MEMORY, AND ASSOCIATED MEMORY DEVICE AND CONTROLLER THEREOF

BACKGROUND OF THE INVENTION

1. Field of the Invention

The present invention relates to access to a Flash memory, and more particularly, to a method of evenly using a plurality of blocks of a Flash memory, and to an associated memory device and a controller thereof.

2. Description of the Prior Art

As technologies of Flash memories progress in recent years, many kinds of portable memory devices, such as memory cards respectively complying with SD/MMC, CF, MS, and XD standards, are widely implemented in various applications. Therefore, the control of access to Flash memories in these portable memory devices has become an important issue.

Taking NAND Flash memories as an example, they can mainly be divided into two types, i.e. Single Level Cell (SLC) Flash memories and Multiple Level Cell (MLC) Flash memories. Each transistor that is considered a memory cell in SLC Flash memories only has two charge levels that respectively represent a logical value 0 and a logical value 1. In addition, the storage capability of each transistor that is considered a memory cell in MLC Flash memories can be fully utilized. More specifically, the voltage for driving memory cells in the MLC Flash memories is typically higher than that in the SLC Flash memories, and different voltage levels can be applied to the memory cells in the MLC Flash memories in order to record information of two bits (e.g. binary values 00, 01, 11, or 10) in a transistor that is considered a memory cell. Theoretically, the storage density of the MLC Flash memories may reach twice the storage density of the SLC Flash memories, which is considered good news for NAND Flash memory manufacturers who encountered a bottleneck of NAND Flash technologies.

As MLC Flash memories are cheaper than SLC Flash memories, and are capable of providing higher capacity than SLC Flash memories while the space is limited, MLC Flash memories have been a main stream for implementation of most portable memory devices on the market. However, various problems of the MLC Flash memories have arisen due to their unstable characteristics. For example, according to the related art, user data will get lost at any time in a situation where the quality of a Flash memory degrades due to long-term use. More particularly, in contrast to the SLC Flash memories, the upper limit of the erase count of each block of the MLC Flash memories is relatively low, which causes the problem of the unstable characteristics to become unacceptable. Thus, a novel method is required for enhancing the control of data access in such a situation where the quality of a Flash memory degrades due to long-term use, in order to guarantee the completeness of user data.

SUMMARY OF THE INVENTION

It is therefore an objective of the claimed invention to provide a method of evenly using a plurality of blocks of a Flash memory, and to provide an associated memory device and a controller thereof, in order to solve the above-mentioned problem.

It is another objective of the claimed invention to provide a method of evenly using a plurality of blocks of a Flash memory, and to provide an associated memory device and a controller thereof, in order to maintain the performance of data access in a situation where the quality of the Flash memory degrades due to long-term use.

It is another objective of the claimed invention to provide a method of evenly using a plurality of blocks of a Flash memory, and to provide an associated memory device and a controller thereof, in order to extend the lifetime of portable memory devices implemented by utilizing the present invention.

According to a preferred embodiment of the claimed invention, a method of evenly using a plurality of blocks of a Flash memory comprises: providing at least one threshold value, which is utilized for sieving out blocks suitable for use from the plurality of blocks according to erase counts of the plurality of blocks; and sieving out a specific block from the plurality of blocks according to a purpose of use by comparing erase counts of at least a portion of the plurality of blocks with the threshold value in order to use the specific block.

While the method mentioned above is disclosed, an associated memory device is further provided. The memory device comprises: a Flash memory comprising a plurality of blocks; and a controller for accessing the Flash memory, wherein the controller is provided with at least one threshold value, in order to sieve out blocks suitable for use from the plurality of blocks according to erase counts of the plurality of blocks. In addition, the controller sieves out a specific block from the plurality of blocks according to a purpose of use by comparing erase counts of at least a portion of the plurality of blocks with the threshold value in order to use the specific block.

While the method mentioned above is disclosed, a controller of a memory device is further provided, where the controller is utilized for accessing a Flash memory comprising a plurality of blocks. The controller comprises: a read only memory (ROM) arranged to store a program code, wherein the controller is provided with at least one threshold value through the program code, in order to sieve out blocks suitable for use from the plurality of blocks according to erase counts of the plurality of blocks; and a microprocessor arranged to execute the program code to control the access to the Flash memory. In addition, the controller that executes the program code by utilizing the microprocessor sieves out a specific block from the plurality of blocks according to a purpose of use by comparing erase counts of at least a portion of the plurality of blocks with the threshold value in order to use the specific block.

According to at least one preferred embodiment of the claimed invention, a method of evenly using a plurality of blocks of a Flash memory is provided. The Flash memory is erased in units of blocks. The method comprises: classifying the plurality of blocks into a data region or a spare region, wherein the blocks in the spare region are blank blocks; recording at least one erase count of at least one block of the spare region; and popping a spare block from the spare region according to the recorded erase count and one of a plurality of purposes of use in order to use the spare block.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 illustrates a recording table of erase counts of respective blocks according to the embodiment shown in FIG. 2.

FIG. 9 illustrates a result of sorting operations that the method shown in FIG. 4 performs with respect to erase counts according to a second embodiment of the present invention.

DETAILED DESCRIPTION

Figure 1:
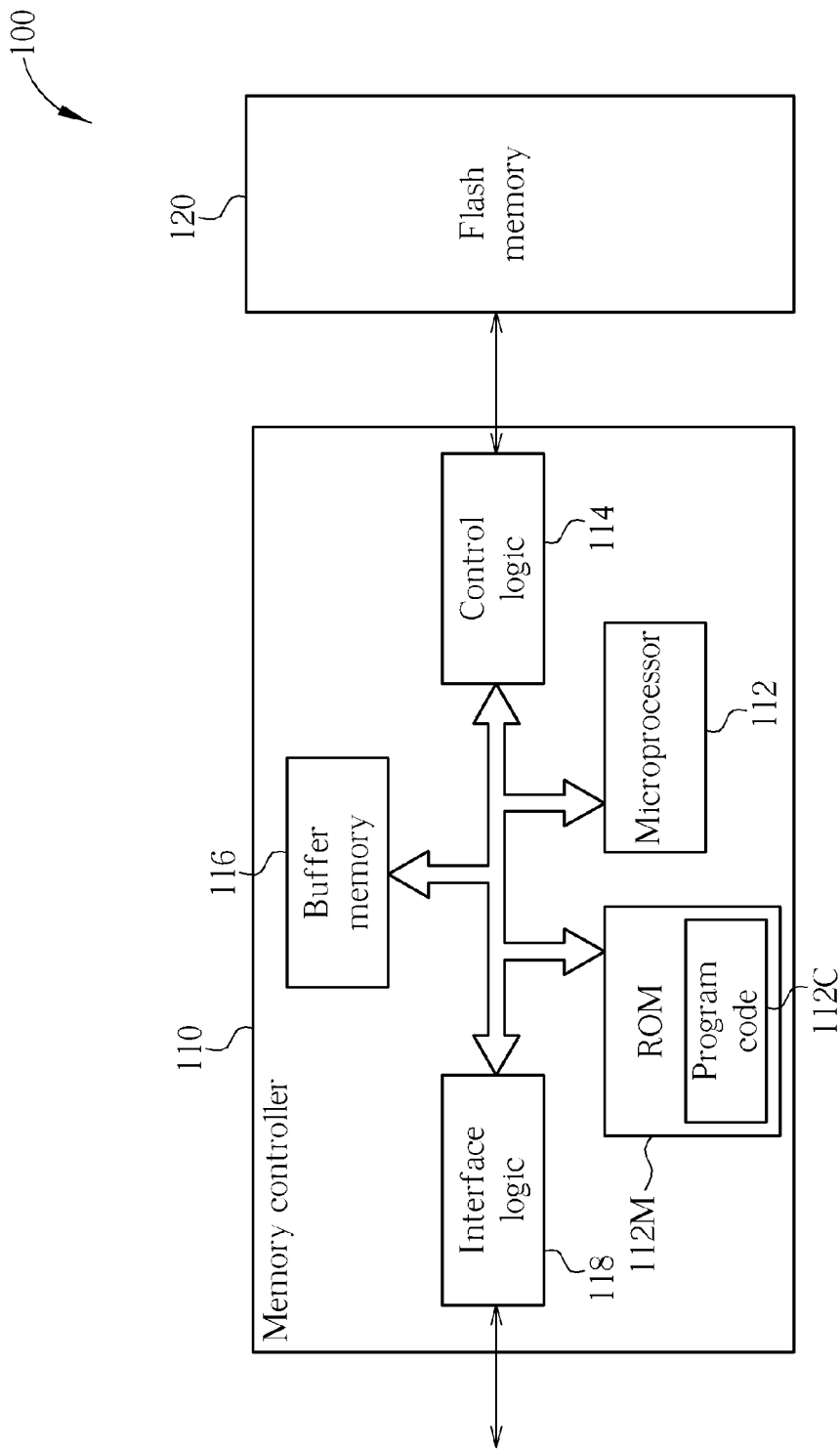
FIG. 1 is a diagram of a memory device according to a first embodiment of the present invention.

Please refer to FIG. 1, which illustrates a diagram of a memory device 100 according to a first embodiment of the present invention. In particular, the memory device 100 of this embodiment is a portable memory device, such as a memory card complying with SD/MMC, CF, MS, or XD standards. The memory device 100 comprises a Flash memory 120, and further comprises a controller arranged to access the Flash memory 120, where the aforementioned controller of this embodiment is a memory controller 110. According to this embodiment, the memory controller 110 comprises a microprocessor 112, a read only memory (ROM) 112M, a control logic 114, a buffer memory 116, and an interface logic 118. The ROM 112M is arranged to store a program code 112C, and the microprocessor 112 is arranged to execute the program code 112C to control the access to the Flash memory 120.

Typically, the Flash memory 120 comprises a plurality of blocks, and the controller (e.g. the memory controller 110 that executes the program code 112C by utilizing the microprocessor 112) performs data erasure operations on the Flash memory 120 by erasing in units of blocks. In addition, a block can be utilized for recording a specific amount of pages, where the controller (e.g. the memory controller 110 that executes the program code 112C by utilizing the microprocessor 112) performs data writing operations on the Flash memory 120 by writing/programming in units of pages.

In practice, the memory controller 110 that executes the program code 112C by utilizing the microprocessor 112 is capable of performing various control operations by utilizing the internal components within the memory controller 110. For example, the memory controller 110 utilizes the control logic 114 to control access to the Flash memory 120 (e.g. operations of accessing at least one block or at least one page), utilizes the buffer memory 116 to perform buffering operations for the memory controller 110, and utilizes the interface logic 118 to communicate with a host device.

According to this embodiment, the controller (more particularly, the memory controller 110 that executes the program code 112C by utilizing the microprocessor 112) is provided with at least one threshold value (e.g. one or more threshold values) through the program code 112C, in order to sieve out blocks suitable for use from the plurality of blocks according to erase counts of the plurality of blocks. In addition, the controller sieves out a specific block from the plurality of blocks according to a purpose of use by comparing erase counts of at least a portion of the plurality of blocks with the threshold value in order to use the specific block.

Figure 2:
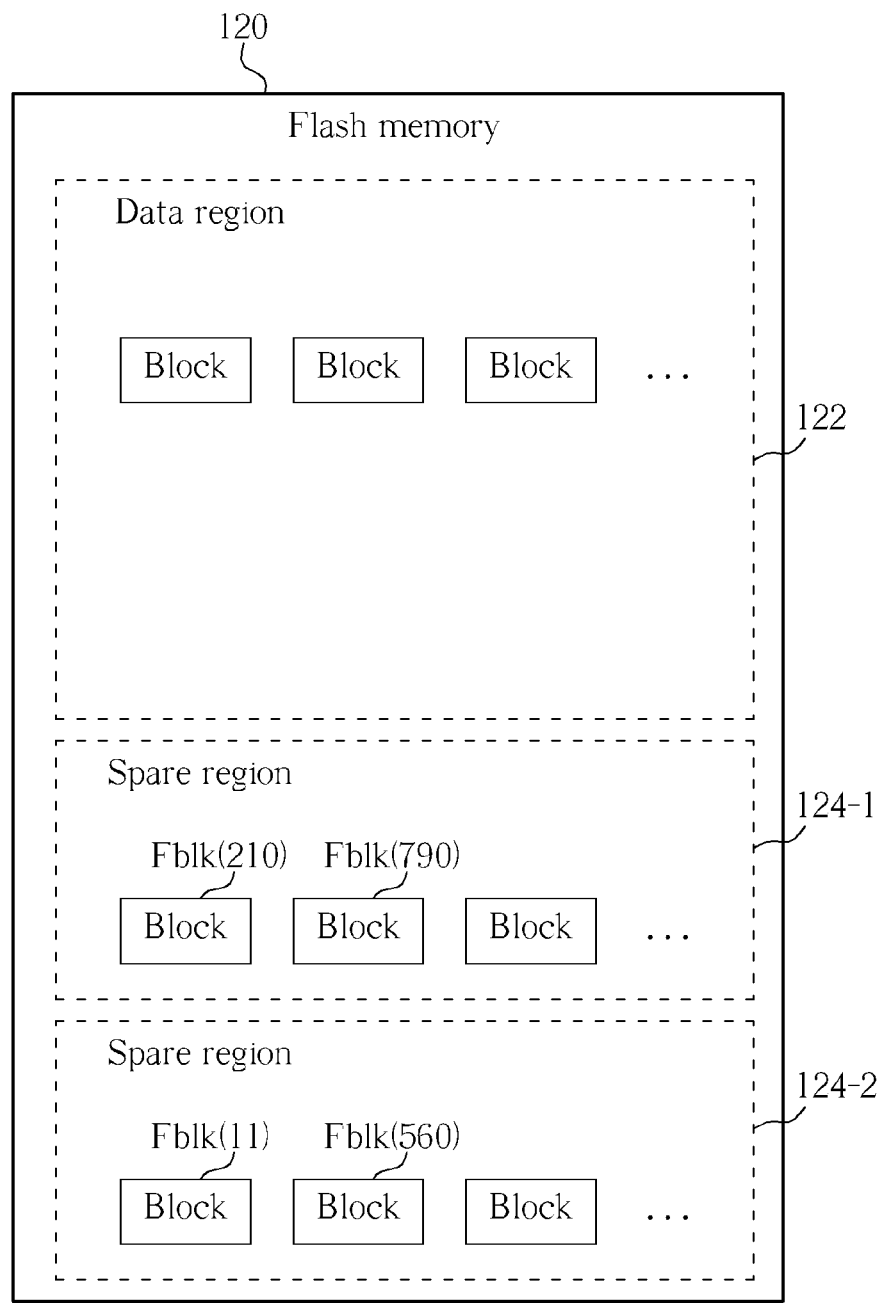
FIG. 2 illustrates a data area/region and a plurality of spare areas/regions of the Flash memory shown in FIG. 1 according to an embodiment of the present invention.

Please refer to FIG. 2 and FIG. 3. FIG. 2 illustrates a data region 122 and a plurality of spare regions 124-1 and 124-2 of the Flash memory 120 shown in FIG. 1 according to an embodiment of the present invention, where the data region 122 can be referred to as a data area, and the spare regions 124-1 and 124-2 can be referred to as spare areas. FIG. 3 illustrates a recording table of erase counts of respective blocks according to the embodiment shown in FIG. 2.

Please note that the block arrangement shown in FIG. 2 is for illustrative purposes only, and is not meant to be a limitation of the present invention. The division by regions represents classifying the blocks, rather than physical region division. More specifically, the blocks Fblk(0), Fblk(1), ..., etc. of this embodiment can be identified by block numbers (or block ID numbers) 0, 1, ..., etc. (i.e. the indexes 0, 1, ..., etc. of Fblk(0), Fblk(1), ..., etc.), which respectively represent the physical addresses of the corresponding blocks. Here, the physical addresses 0, 1, ..., etc. are utilized for identifying and describing these blocks Fblk(0), Fblk(1), ..., etc. for better comprehension. In addition, regarding the region distribution of the blocks of the Flash memory 120, at least one look-up table (LUT) can be utilized for implementation. For example, the LUT can indicate whether a block is logically positioned in the data region 122 or one of the spare regions 124-1 and 124-2.

In this embodiment, the controller (e.g. the memory controller 110 that executes the program code 112C by utilizing the microprocessor 112) can update the recording table any time, and more particularly, the erase counts of respective blocks within the recording table. In practice, the controller dynamically adjusts the at least one threshold value (e.g. one or more threshold values). For example, the controller can temporarily store the recording table in the buffer memory 116, and further subtract a common value from the erase counts of the blocks to decrease the data amount of the erase counts stored in the recording table. Therefore, dynamically adjusting the threshold value(s) can prevent them from being unsuitable for use due to the variations of the erase counts in this situation. In addition, in response to a specific request, the controller of this embodiment can store/move the data of the buffer memory 116 into the Flash memory 120 in order to spare the storage space of the buffer memory 116 for the specific request. Afterward, when the specific request no longer exists, the controller restores the buffer memory 116, so that the data previously stored/moved into the Flash memory 120 can be moved back to the buffer memory 116. Thus, in a situation where the storage space is limited, the controller can prevent the shortage of the storage space in the buffer memory 116.

In this embodiment, the controller compares the erase count with the threshold value, in order to determine a spare region, into which a block that should belong to the spare regions should be classified. More specifically, if the erase count reaches the threshold value, the controller classifies the block into the spare region 124-1; otherwise, the controller classifies the block into the spare region 124-2. For example, the threshold value is equal to 7, and the controller (e.g. the memory controller 110 that executes the program code 112C by utilizing the microprocessor 112) can determine that the erase counts of the blocks Fblk(11), Fblk(210), Fblk(560), and Fblk(790) are respectively 2, 10, 5, and 9 according to the recording table shown in FIG. 3, where the erase counts of the blocks Fblk(210) and Fblk(790) are greater than the threshold value 7, and the erase counts of the blocks Fblk(11) and Fblk(560) do not reach the threshold value 7. As a result, the controller classifies the blocks Fblk(210) and Fblk(790) into the spare region 124-1, and classifies the blocks Fblk(11) and Fblk(560) into the spare region 124-2.

According to this embodiment, the number of the plurality of spare regions shown in FIG. 2 is two, and by utilizing the at least one threshold value, the controller (more particularly, the memory controller 110 that executes the program code 112C by utilizing the microprocessor 112) can classify the blocks that should belong to the spare regions into a spare region of the spare regions. However, this is for illustrative purposes only, and is not meant to be a limitation of the present invention. According to a variation of this embodiment, the at least one threshold value comprises a plurality of threshold values, such as M threshold values Th(1), Th(2), . . . , and Th(M) with an order of increasing values (i.e. Th(1) ≦Th(2)≦ . . . ≦Th(M)), and the spare regions comprise (M+1) spare regions SA (0), SA (1), . . . , and SA (M). In addition, by utilizing the M threshold values Th(1), Th(2), . . . , and Th(M), the controller can classify a block into a spare region of the (M+1) spare regions SA(0), SA(1), . . . , and SA(M) according to the erase count of the block. In practice, the controller divides the range of the values of the erase counts into (M+1) intervals [0, Th(1)), [Th(1), Th(2)), . . . , and [Th(M), Th$_{MAX}$] according to the M threshold values Th(1), Th(2), . . . , and Th(M), where the (M+1) intervals [0, Th(1)), [Th(1), Th(2)), . . . , and [Th(M), Th$_{MAX}$] correspond to the (M+1) spare regions SA(0), SA(1), . . . , and SA(M), and Th$_{MAX}$ represents the maximal value available in the numeral expression of the erase counts due to the software/hardware limitations.

According to this variation, when there is no blank block available for popping/sieving out from a certain spare region SA(k) of the (M+1) spare regions SA(0), SA(1), . . . , and SA(M), the controller can sieve out a block from a spare region adjacent to the spare region SA(k) (i.e. the previous spare region SA(k−1) or the next spare region SA(k+1)). In a situation where there is still no blank block available for popping/sieving out from the spare regions adjacent to the spare region SA(k), the controller can sieve out a block from a spare region near the spare region SA(k) (e.g. a spare region of the spare regions SA(k−2), SA(k−3), . . . , etc., or a spare region of the spare regions SA(k+2), SA(k+3), . . . , etc.).

In practice, the spare regions 124-1 and 124-2 provided in the embodiment shown in FIG. 2 can be utilized for sieving out the block during block swapping. Thus, the controller sieves out the specific block from the blocks to perform block swapping. For example, according to a block swapping threshold value, the controller can determine whether the erase counts of the blocks in the spare regions are too high and determine whether block swapping is required, where the block swapping threshold value is greater than the threshold value for performing the classifying operations disclosed above. In this variation, the block swapping threshold value is 10, which is greater than the threshold value for performing the classifying operations, so the controller can determine whether the blocks to be classified into the spare region 124-1 require block swapping. However, this is for illustrative purposes only, and is not meant to be a limitation of the present invention. According to a variation of this embodiment, the controller can determine whether the blocks that have been classified into the spare region 124-1 or the spare region 124-2 require block swapping. For example, when the controller is going to sieve out a blank block that has been erased from the spare region 124-1 for a purpose of writing, the controller detects that the erase count of the blank block is 10, and therefore, the controller selects a block having the lowest erase count from the data region in order to perform block swapping on the block having the lowest erase count and the blank block. According to another variation of this embodiment, before determining whether a block should be classified into the spare region 124-1 or the spare region 124-2, the controller can determine whether block swapping is required according to whether the erase count of this block reaches the block swapping threshold value.

According to this variation, when the erase count of a certain block in the spare regions is greater than the block swapping threshold value, the controller determines to perform block swapping, and more particularly, to classify the certain block into the data region 122, in order to reduce the utility rate of the block. For block swapping, the controller sieves out the blocks having lower erase counts than others from the data region 122, and more particularly, the controller sieves out the block having the lowest erase count from the data region 122, so the sieved block is classified into one of the spare regions. As a result, the controller swaps the block having the lowest erase count in the data region 122 and the certain block, whose erase count is greater than the block swapping threshold value. Regarding the spare regions, the aforementioned purpose of use comprises the purpose of "swapping block(s) of the data region 122 and block(s) of the spare regions." Thus, by performing block sieving according to the purpose of use, the present invention can achieve the goal of extremely evenly using the blocks of the Flash memory 120.

According to another variation of this embodiment, regarding the blocks that should belong to the spare regions, the controller sorts at least a portion of the plurality of blocks by comparing the erase counts of at least a portion of the blocks that should belong to the spare regions with the threshold value, and frequently updates the sorted result. For example, the blank blocks of the spare regions are classified into the spare region 124-1 or the spare region 124-2 according to a threshold value 7, and the controller can merely sort the blank blocks belonging to the spare region 124-1, or merely sort the blank blocks belonging to the spare region 124-2, or merely sort the blank blocks of all of the spare regions (e.g. the spare region 124-1 and the spare region 124-2). As a result, according to the purpose of use, the controller can determine a sorted portion from which the specific block should be sieved out for use, where the sorted portion represents a portion of the sorted result.

According to another variation of this embodiment, the controller does not first classify or sort at least a portion of the blocks that should belong to the spare regions. When the controller is going to sieve out a specific block from the spare regions according to a purpose of use in order to use the specific block, the controller can selectively sieve out a blank block from the spare regions directly according to the erase counts of respective blocks, at least one threshold value, or a purpose of use, in order to use the specific block for writing.

In contrast to the related art, the memory controller 110 of this invention operates in a prophylactic manner (e.g. the controller can frequently sieve out a specific block from the plurality of blocks according to a purpose of use by comparing the erase counts of at least a portion of the plurality of blocks with the threshold value in order to use the specific block), the present invention can extremely evenly use the blocks of the Flash memory 120 in order to prevent user data from being lost in a situation where the quality of the Flash memory 120 degrades due to long-term use. In addition, the present invention can maintain the performance of data access in a situation where the quality of the Flash memory 120 degrades due to long-term use, and prevent some related art problems. For example, the present invention can prevent making a misjudgment regarding bad blocks. According to the related art, a good block of a portable memory device can be marked as a bad block when it is too late to correct errors thereof, and therefore, the lifetime of the portable memory device will be unreasonably shortened when the number of bad blocks in this portable memory device increases in this manner. The present invention can prevent this situation, and will not waste any good block. Therefore, the present invention can effectively reduce the number of bad blocks, and further extend the lifetime of portable memory devices. Please refer to FIG. 4 for further details.

Figure 4:
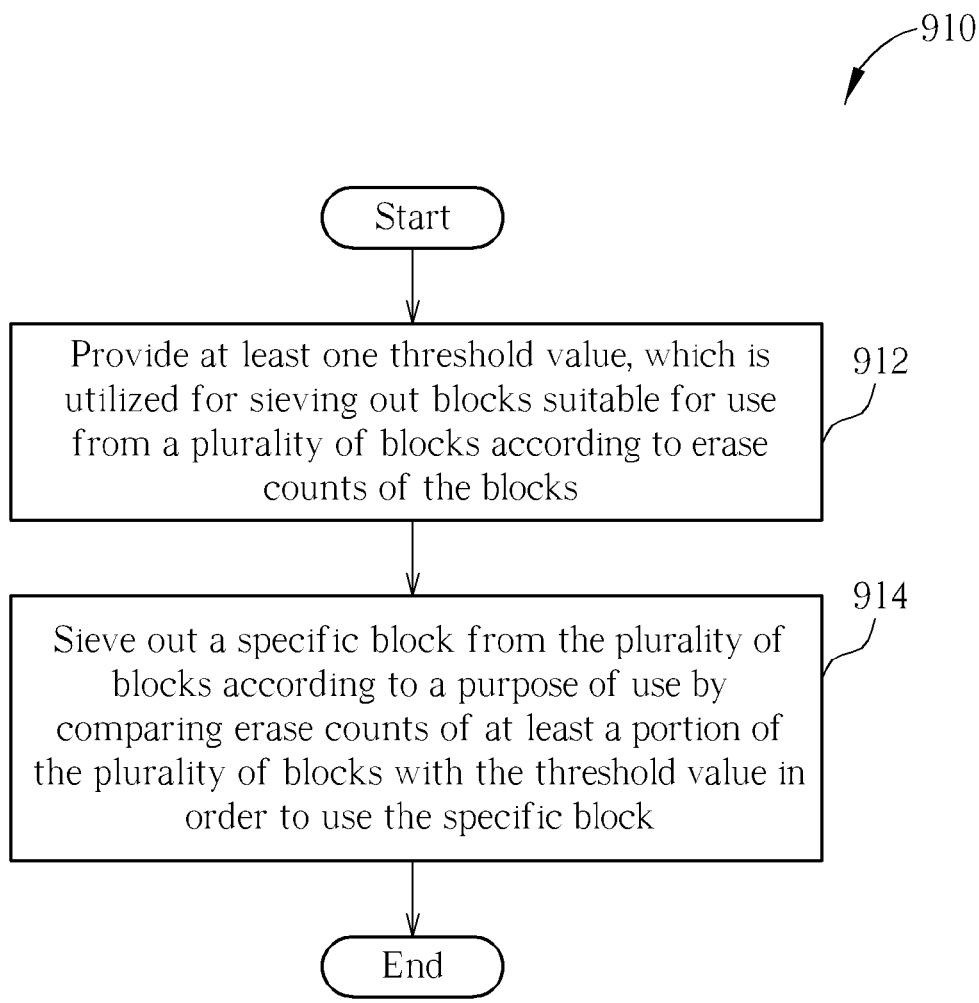
FIG. 4 is a flowchart of a method of evenly using a plurality of blocks of a Flash memory according to an embodiment of the present invention.

FIG. 4 is a flowchart of a method 910 of evenly using a plurality of blocks of a Flash memory according to an embodiment of the present invention. The method can be applied to the memory device 100 shown in FIG. 1, and more particularly, to the controller mentioned above (e.g. the memory controller 110 that executes the program code 112C by utilizing the microprocessor 112). In addition, the method can be implemented by utilizing the memory device 100 shown in FIG. 1, and more particularly, by utilizing the controller mentioned above (e.g. the memory controller 110 that executes the program code 112C by utilizing the microprocessor 112). The method is described as follows.

In Step 912, provide at least one threshold value (e.g. one or more threshold values), which is utilized for sieving out blocks suitable for use from the plurality of blocks according to the erase counts of the plurality of blocks. More particularly, the controller (e.g. the memory controller 110 that executes the program code 112C by utilizing the microprocessor 112) is provided with the at least one threshold value through the program code 112C, in order to sieve out blocks suitable for use from the plurality of blocks according to the erase counts of the plurality of blocks.

In Step 914, the controller sieves out a specific block from the plurality of blocks according to a purpose of use by comparing erase counts of at least a portion of the plurality of blocks with the threshold value in order to use the specific block. More particularly, when the purpose of use corresponds to the frequency of erasure of the blocks to be utilized, as the controller performs block sieving according to the purpose of use by comparing the erase counts of at least a portion of the plurality of blocks with the threshold value, the goal of extremely evenly using the blocks of the Flash memory 120 can be achieved. Regarding the aforementioned purpose of use, please refer to FIGS. 5-8 for further explanation.

Figure 5:
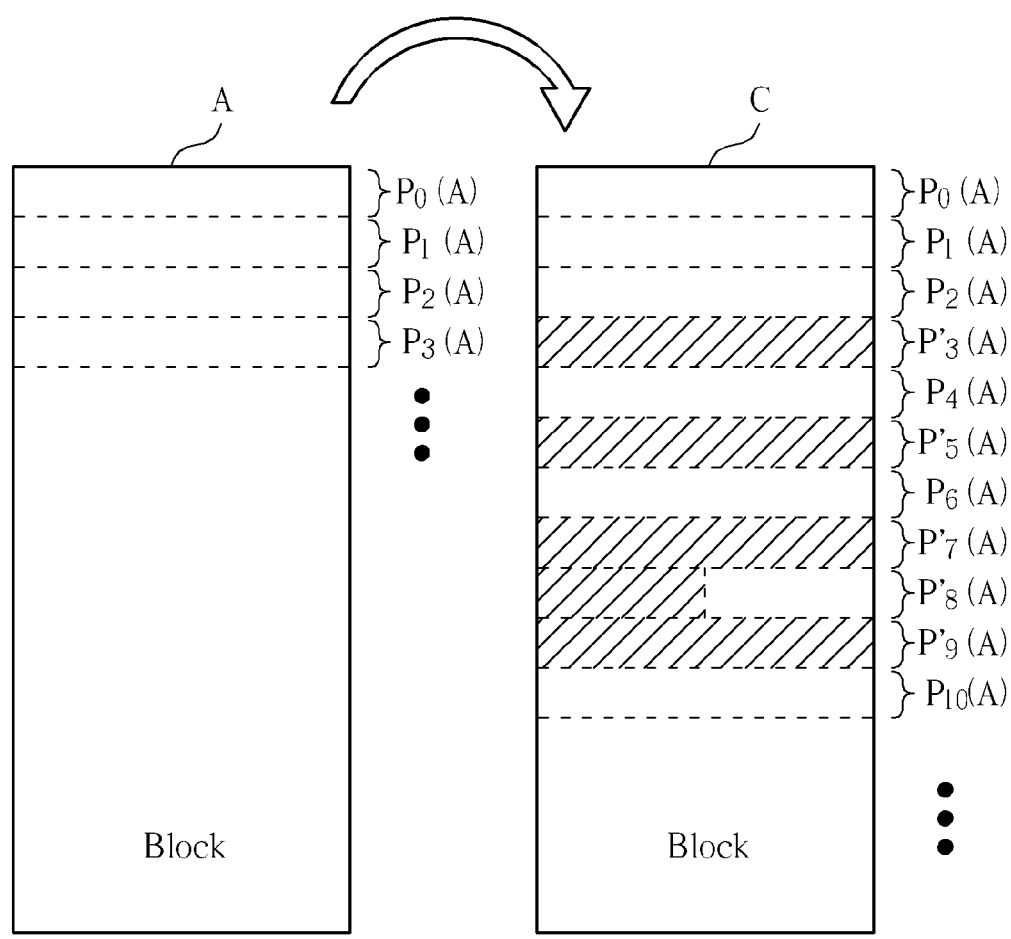
FIG. 5 illustrates blocks of certain purposes of use that are involved in the method shown in FIG. 4 according to an embodiment of the present invention, where the blocks shown in FIG. 5 comprise a mother block and a child block.

FIG. 5 illustrates blocks of certain purposes of use that are involved in the method shown in FIG. 4 according to an embodiment of the present invention, where the blocks shown in FIG. 5 comprise a mother block A and a child block C. According to this embodiment, the mother block A is a block in the data region 122, and when a portion of data in the mother block A should be updated, the controller pops/sieves out a block from a spare region of the spare regions, in order to utilize this block as the child block C. For example, when the data $P_3(A)$ positioned in the fourth page Fpage$(3)_A$ of the mother block A needs to be updated, the memory controller 110 sieves out a block from the spare region 124-1 as the child block C, and copies the data $P_0(A)$, $P_1(A)$, and $P_2(A)$ respectively positioned in the first three pages Fpage$(0)_A$, Fpage$(1)_A$, and Fpage$(2)_A$ of the mother block A into the first three pages Fpage$(0)_C$, Fpage$(1)_C$, and Fpage$(2)_C$ of the child block C (i.e. the same relative positions as in the mother block A), and then writes/programs the updated data $P'_3(A)$ of the fourth page Fpage$(3)_A$ into the subsequent position in the child block C, i.e. Fpage$(3)_C$. As a result, the first four pages Fpage$(0)_C$, Fpage$(1)_C$, Fpage$(2)_C$, and Fpage$(3)_C$ of the child block C can be labeled as $P_0(A)$, $P_1(A)$, $P_2(A)$, and $P'_3(A)$, respectively.

Then, when the data $P_5(A)$ positioned in the sixth page Fpage$(5)_A$ of the mother block A needs to be updated, the memory controller 110 copies the data $P_4(A)$ positioned in the fifth page Fpage$(4)_A$ of the mother block A into the child block C, and writes/programs the updated data $P'_5(A)$ of the sixth page Fpage$(5)_A$ into the subsequent position in the child block C, i.e. Fpage$(5)_C$. As a result, the fifth page Fpage$(4)_C$ and the sixth page Fpage$(5)_C$ of the child block C can be labeled as $P_4(A)$ and $P'_5(A)$, respectively. Similarly, when the data $P_7(A)$ positioned in the eighth page Fpage$(7)_A$ of the mother block A needs to be updated, the memory controller 110 copies the data $P_6(A)$ positioned in the seventh page Fpage$(6)_A$ of the mother block A into the child block C, and writes/programs the updated data $P'_7(A)$ of the eighth page Fpage$(7)_A$ into the subsequent position in the child block C, i.e. Fpage$(7)_C$. As a result, the two pages starting from the seventh page in the child block C (i.e. the pages Fpage$(6)_C$ and Fpage$(7)_C$) can be labeled as $P_6(A)$ and $P'_7(A)$, respectively. Thus, regarding the typical operations of the mother and child blocks, the memory controller 110 of this embodiment selectively copies the data that does not need to be updated from the mother block into the same page(s) of the child block (i.e. the same relative position(s) as in the mother block), and writes/programs the updated data received from the host into the child block. More particularly, whenever there is at least one page that does not need to be updated (e.g. Fpage$(0)_A$-Fpage$(2)_A$, Fpage$(4)_A$, or Fpage$(6)_A$) prior to a certain page that needs to be updated (e.g. Fpage$(3)_A$, Fpage$(5)_A$, or Fpage$(7)_A$), if the data of the page(s) that does not need to be updated (e.g. Fpage$(0)_A$-Fpage$(2)_A$, Fpage$(4)_A$, or Fpage$(6)_A$) has not been written/programmed into the child block C, the memory controller 110 copies the data of the page(s) that does not need to be updated (e.g. Fpage$(0)_A$-Fpage$(2)_A$, Fpage$(4)_A$, or Fpage$(6)_A$) from the mother block into the same page(s) of the child block (i.e. the same relative position(s) as in the mother block), and then writes/programs the updated data of the page that needs to be updated (e.g. Fpage$(3)_A$, Fpage$(5)_A$, or Fpage$(7)_A$) into the child block C, where the updated data is received from the host.

Figure 6:
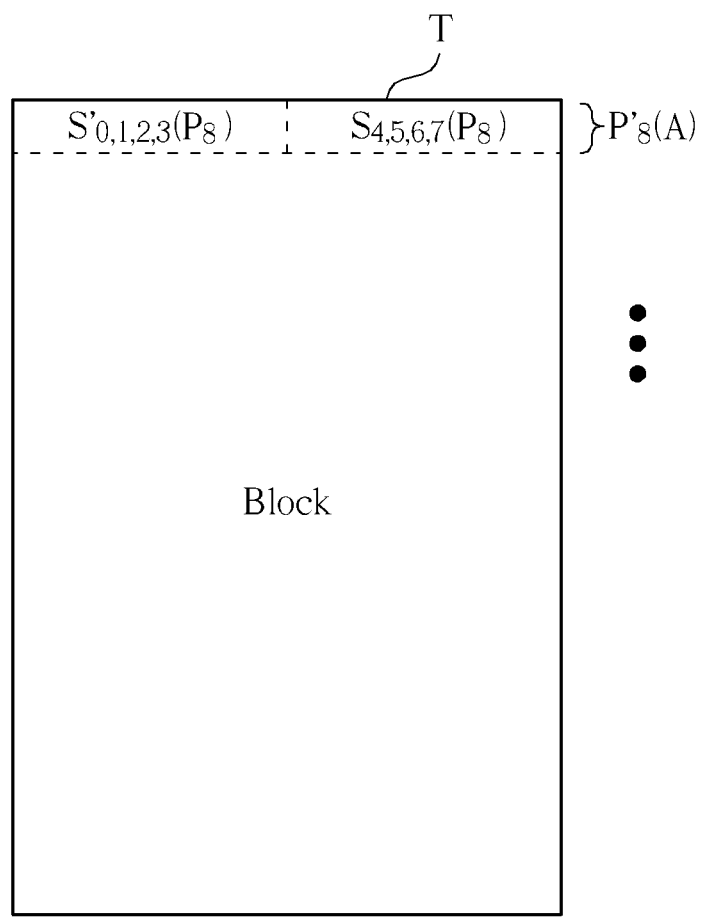
FIG. 6 illustrates a block of a certain purpose of use that is involved in the method shown in FIG. 4 according to the embodiment shown in FIG. 5, where the block shown in FIG. 6 is a temporary block.

FIG. 6 illustrates a block of a certain purpose of use that is involved in the method shown in FIG. 4 according to the embodiment shown in FIG. 5, where the block shown in FIG. 6 is a temporary block T. When a portion of data of the mother block A needs to be updated, and more particularly, in a situation where the data amount of the portion of data is small and less than that of a page and the portion of data does not comprise the last sector of the page, frequently updating such a tiny amount of data will lead to inconvenience of access management of the child block C, probably causing an eventually increased number of times of block swapping that the memory controller 110 performs on the Flash memory 120. Therefore, the controller should sieve out another block from a spare region of the spare regions, in order to utilize the sieved block as the temporary block T. For example, when the first four sectors $S_{0,1,2,3}(P_8)$ of a page Fpage(8)$_A$ of the mother block A need to be updated, the memory controller 110 sieves out a block from the spare region 124-2 to utilize the sieved block as the temporary block T, and writes/programs the updated data of this page Fpage(8)$_A$ (i.e. the updated data comprising the updated first four sectors $S'_{0,1,2,3}(P_8)$ and the original last four sectors $S_{4,5,6,7}(P_8)$ read from the mother block A) into the first page Fpage(0)$_T$ of the temporary block T. Thus, the memory controller 110 of this embodiment allows frequently updating such a tiny amount of data. For example, the memory controller 110 can frequently update a certain sector or more than one sector of the page $P_8(A)$.

When the data $P_9(A)$ positioned in the tenth page Fpage(9)$_A$ of the mother block A needs to be updated, the memory controller 110 copies the data $P'_8(A)$ positioned in the first page Fpage(0)$_T$ of the temporary block T into the ninth page Fpage(8)$_C$ of the child block C, and writes/programs the updated data $P'_9(A)$ of the tenth page Fpage(9)$_A$ into the subsequent position in the child block C, i.e. Fpage(9)$_C$. As a result, the two pages starting from the ninth page Fpage(8)$_C$ in the child block C (i.e. the pages Fpage(8)$_C$ and Fpage(9)$_C$) can be labeled as $P'_8(A)$ and $P'_9(A)$, respectively. For better comprehension, referring to FIG. 5, the first half of the data $P'_8(A)$ of the ninth page Fpage(8)$_C$ in the child block C is shaded in the same way as in some other positions where there is updated data.

According to this embodiment, when some conditions for merging are satisfied, the memory controller 110 merges at least one set of mother/child blocks, where each set of mother/child blocks includes a mother block and a child block, such as the mother block A and the child block C. More particularly, the memory controller 110 merges a set of mother/child blocks into the child block. For example, a condition for merging is that the number of child blocks reaches a predetermined value. In a situation where this condition is satisfied, the memory controller 110 can merge a set of mother/child blocks. In another example, a condition for merging is that the number of sets of mother/child blocks reaches a predetermined value. In a situation where this condition is satisfied, the memory controller 110 can merge a set of mother/child blocks. Therefore, when the child block C is fully programmed or any of the conditions mentioned above is satisfied, the memory controller 110 can classify the child block C into the data region 122 and merge required data of the mother block A (e.g. the data of the pages starting from the eleventh page Fpage(10)$_A$) and required data of the temporary block T (if exists) into the child block C. Then, the memory controller 110 erases the corresponding temporary block T and mother block A, and classifies the temporary block T and the mother block A into one of the spare regions.

Regarding the temporary block T and the mother block A to be classified into one of the spare regions, the memory controller 110 of this embodiment can respectively classify the temporary block T and the mother block A into the spare region 124-1 or the spare region 124-2. However, this is for illustrative purposes only, and is not meant to be a limitation of the present invention. According to a variation of this embodiment, the memory controller 110 can sort the temporary block T and the mother block A according to their erase counts.

In this embodiment, the blocks in the spare region 124-1 are the blocks that are classified as a group having greater erase counts according to the threshold value (e.g. the threshold value is 7), and the blocks in the spare region 124-2 are the blocks that are classified as a group having less erase counts according to the threshold value. During the merging operations for the set(s) of mother/child blocks, the child block C should be classified into the data region 122, and the temporary block T should be erased, so the frequency of erasure of the temporary block T is much greater than the frequency of erasure of the child block C. Therefore, by sieving out a block from the spare region 124-1 as the child block C and by sieving out a block from the spare region 124-2 as the temporary block T, the goal of extremely evenly using the blocks of the Flash memory 120 can be achieved.

Figure 7:
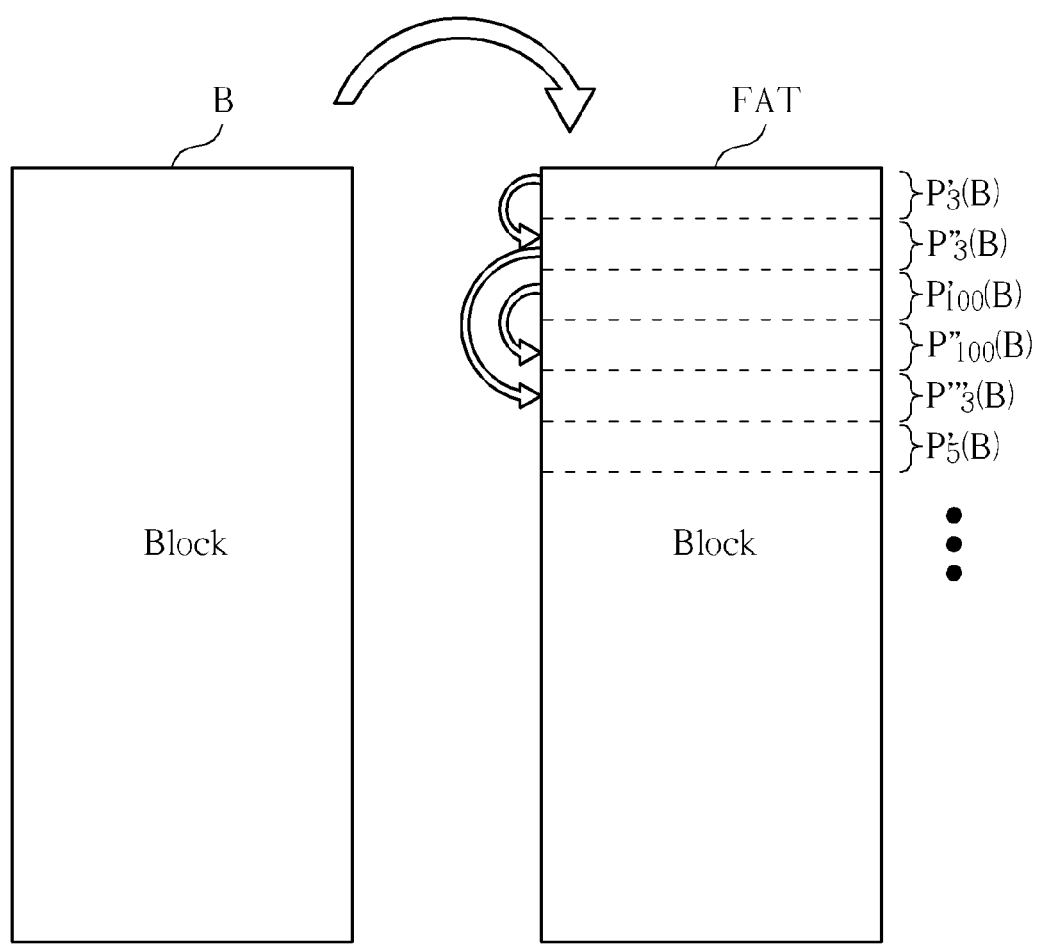
FIG. 7 illustrates blocks of certain purposes of use that are involved in the method shown in FIG. 4 according to another embodiment of the present invention, where the blocks shown in FIG. 7 comprise a mother block and a file allocation table (FAT) block.

FIG. 7 illustrates blocks of certain purposes of use that are involved in the method shown in FIG. 4 according to another embodiment of the present invention, where the blocks shown in FIG. 7 comprise a mother block B and a file allocation table (FAT) block FAT. This embodiment is a variation of the embodiment shown in FIG. 5, and the controller of this embodiment can perform the associated operations of the embodiment shown in FIG. 5.

According to this embodiment, the mother block B is a block in the data region 122, and when a portion of data in the mother block B should be updated, the controller pops/sieves out a block from a spare region of the spare regions, in order to utilize this block as the file allocation table block FAT. For example, when the data $P_3(B)$ positioned in the fourth page Fpage(3)$_B$ of the mother block B needs to be updated, the memory controller 110 sieves out a block from the spare region 124-2 as the file allocation table block FAT, and writes/programs the updated data $P'_3(B)$ of the fourth page Fpage(3)$_B$ into the beginning of the file allocation table block FAT, i.e. the first page Fpage(0)$_{FAT}$. Then, when the fourth page Fpage(3)$_B$ of the mother block B needs to be further updated, the memory controller 110 writes/programs the updated data $P'''_3(B)$ of the fourth page Fpage(3)$_B$ into the second page Fpage(1)$_{FAT}$ of the file allocation table block FAT.

Similarly, when the data $P_{100}(B)$ positioned in the $101^{st}$ page Fpage(100)$_B$ of the mother block B needs to be updated, the memory controller 110 writes/programs the updated data $P'_{100}(B)$ of the $101^{st}$ page Fpage(100)$_B$ into the third page Fpage(2)$_{FAT}$ of the file allocation table block FAT. Then, when the $101^{st}$ page Fpage(100)$_B$ of the mother block B needs to be further updated, the memory controller 110 writes/programs the updated data $P'''_{100}(B)$ of the $101^{st}$ page Fpage(100)$_B$ into the subsequent page of the third page Fpage(2)$_{FAT}$, i.e. the fourth page Fpage(3)$_{FAT}$.

Afterward, when the data $P_3(B)$ positioned in the fourth page Fpage(3)$_B$ of the mother block B needs to be updated, the memory controller 110 writes/programs the updated data $P'''_3(B)$ of the fourth page Fpage(3)$_B$ into the fifth page Fpage(4)$_{FAT}$ of the file allocation table block FAT. Then, when the sixth page Fpage(5)$_B$ of the mother block B needs to be further updated, the memory controller 110 writes/programs the updated data $P'_5(B)$ of the sixth page Fpage(5)$_B$ into the subsequent page of the recently updated page of the file allocation table block FAT (i.e. the sixth page Fpage(5)$_{FAT}$), and so on.

In practice, the controller can store at least one page mapping table at a specific position in the file allocation table block FAT, where the page mapping table is utilized for recording all mapping relationships between the pages needing to be updated in the mother block B (i.e. the original pages) and the replacement pages in the file allocation table block FAT (i.e. the new pages having updated data). However, this is for illustrative purposes only, and is not meant to be a limitation of the present invention. According to a variation of this embodiment, the controller can store the page mapping table at a subsequent position of a certain replacement page in the file allocation table block FAT. More particularly, when the at least one page mapping table comprises a plurality of page mapping tables, the controller can store the page mapping tables at subsequent positions of some replacement pages in the file allocation table block FAT, where the page mapping tables respectively represents the latest mapping relationships at the time points when they are written.

In this embodiment, the blocks in the spare region 124-1 are the blocks that are classified as a group having greater erase counts according to the threshold value (e.g. the threshold value is 7), and the blocks in the spare region 124-2 are the blocks that are classified as a group having less erase counts according to the threshold value. Please note that the file allocation table block FAT should be erased during the merging operations for the mother block B and the file allocation table block FAT. Therefore, when selecting a block as the file allocation table block FAT, the memory controller 110 selects/sieves out a block having a lower erase count than others as the file allocation table block FAT, and more particularly, the memory controller 110 selects/sieves out a block from the spare region 124-2 as the file allocation table block FAT. The frequency of erasure of the file allocation table block FAT is much greater than the frequency of erasure of the child block C. Therefore, by sieving out a block from the spare region 124-2 as the file allocation table block FAT, the goal of extremely evenly using the blocks of the Flash memory 120 can be achieved.

For example, when popping a block as the file allocation table block FAT is required, the memory controller 110 should sieve out a blank block from the spare region 124-2 as the file allocation table block FAT. In a hypothetic situation where the memory controller 110 sieves out a blank block such as the block Fblk(790) having an erase count of 9 from the spare region 124-1 to utilize the block Fblk(790) as the file allocation table block FAT, the erase count of the block Fblk (790) will rapidly reach an erase count threshold value of block swapping (e.g. the block swapping threshold value 10 mentioned above). On the contrary, in a real situation, when the memory controller 110 sieves out a blank block such as the block Fblk(11) having an erase count of 2 from the spare region 124-2 to utilize the block Fblk(11) as the file allocation table block FAT, even if the block Fblk(11) is erased in a short time (e.g. the erase count thereof increases to be 3), it would be a long time before the erase count of the block Fblk(11) reaches the erase count threshold value of block swapping. Therefore, in contrast to the related art, the present invention can greatly reduce the number of block swapping.

Figure 8:
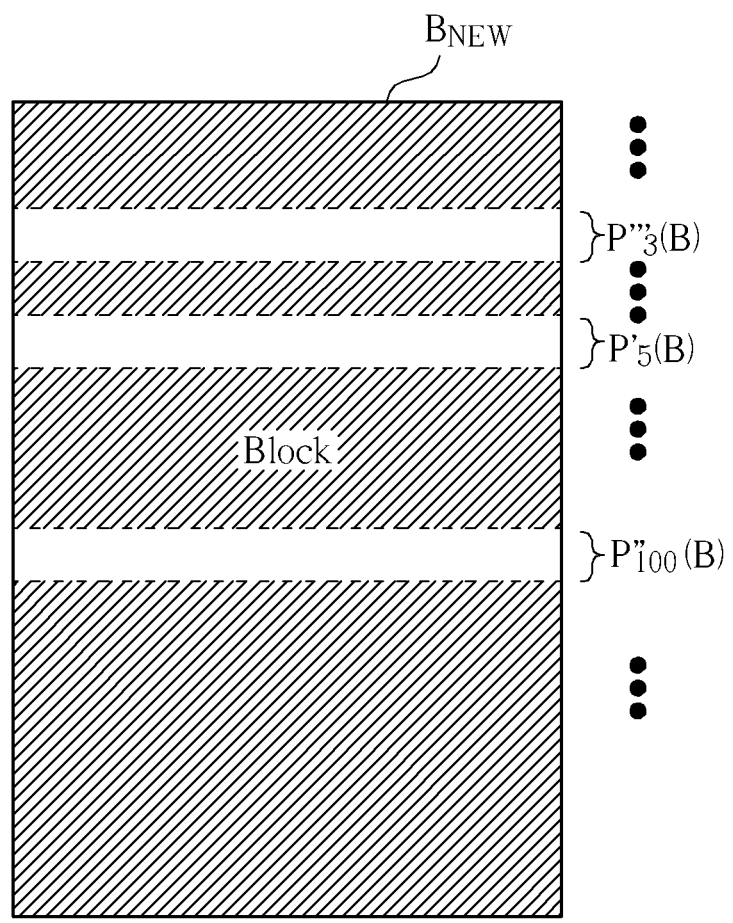
FIG. 8 illustrates a block of a certain purpose of use that is involved in the method shown in FIG. 4 according to the embodiment shown in FIG. 7, where the block shown in FIG. 8 is a new block.

FIG. 8 illustrates a block of a certain purpose of use that is involved in the method shown in FIG. 4 according to the embodiment shown in FIG. 7, where the block shown in FIG. 8 is a new block $B_{NEW}$, which represents an updated version of the mother block B. In this embodiment, when the file allocation table block FAT is going to be fully written/programmed, the memory controller 110 sieves out a block from the spare region 124-1 as the new block $B_{NEW}$, and writes the latest data belonging to the mother block B into the new block $B_{NEW}$. For example, the latest data belonging to the mother block B comprises the original data read from the first three pages $Fpage(0)_B$, $Fpage(1)_B$, and $Fpage(2)_B$ of the mother block B, the updated data $P'''_3(B)$ read from the fifth page $Fpage(4)_{FAT}$ of the file allocation table block FAT, the original data read from the fifth page $Fpage(4)_B$ of the mother block B, the updated data $P'_5(B)$ read from the sixth page $Fpage(5)_{FAT}$ of the file allocation table block FAT, the data read from the subsequent tens of pages of the mother block B, the updated data $P''_{100}(B)$ read from the fourth page $Fpage(3)_{FAT}$ of the file allocation table block FAT, the original data read from the subsequent remaining pages of the mother block B, etc.

When sieving out the new block $B_{NEW}$, the memory controller 110 classifies the new block $B_{NEW}$ into the data region 122. Regarding the new block $B_{NEW}$ that has been classified into the data region 122, the probability of being re-erased is very low due to its stay in the data region 122 for a long time. Therefore, the memory controller 110 sieves out a block having a greater erase count than others as the new block $B_{NEW}$, and more particularly, the memory controller 110 sieves out a block from the spare region 124-1 as the new block $B_{NEW}$. Similarly, the frequency of erasure of the new block $B_{NEW}$ is much less than the frequency of erasure of the file allocation table block FAT, and therefore, by sieving out a block from the spare region 124-1 as the new block $B_{NEW}$, the goal of extremely evenly using the blocks of the Flash memory 120 can be achieved.

According to a variation of this embodiment, the aforementioned at least one threshold value comprises the M threshold values Th(1), Th(2), . . . , and Th(M). More particularly, the operations of the memory controller 110 are similar to the aforementioned variation with regard to the M threshold values Th(1), Th(2), . . . , and Th(M). In response to a situation where the frequency of erasure may varies for the blocks of various purposes of use (e.g. the mother blocks A and B, the child block C, the temporary block T, the file allocation table block FAT, and the new block $B_{NEW}$ as shown in FIGS. 5-8), the controller of this variation pops/sieves out blocks from different spare regions of the (M+1) spare regions respectively for different purposes of use, such as the purpose of "utilizing the sieved block as a mother/new block", the purpose of "utilizing the sieved block as a child block", the purpose of "utilizing the sieved block as a temporary block", the purpose of "utilizing the sieved block as a file allocation table block", etc.

According to this variation, when some conditions for merging are satisfied, the memory controller 110 merges at least one set of mother/file allocation table blocks, where each set of mother/file allocation table blocks includes a mother block and a file allocation table block. The conditions for merging the set of mother/file allocation table blocks are similar to those disclosed in the embodiment of merging the at least one set of mother/child blocks, and therefore, are not repeated in detail here.

Similarly, when any of the abovementioned conditions for merging the file allocation table block is satisfied, the memory controller 110 can sieve out the new block $B_{NEW}$ and classify the new block $B_{NEW}$ into the data region 122, and merge required data within the mother block B and the file allocation table block FAT into the new block $B_{NEW}$. Then, the memory controller 110 erases the mother block B and the corresponding file allocation table block FAT, and classifies the erased mother block B and the corresponding file allocation table block FAT into one of the spare regions, respectively.

Regarding the temporary block T, the mother block B, and the file allocation table block FAT that are respectively classified into the spare region(s), the memory controller 110 of this variation can classify the temporary block T into one of the (M+1) spare regions according to the erase count thereof, classify the mother block B into one of the (M+1) spare regions according to the erase count thereof, and classify the file allocation table block FAT into one of the (M+1) spare regions according to the erase count thereof. More particularly, the memory controller 110 classifies the temporary block T, the mother block B, and the file allocation table block FAT into different spare regions of the (M+1) spare regions. However, this is for illustrative purposes only, and is not meant to be a limitation of the present invention. According to a variation of this embodiment, the memory controller 110 can sort the temporary block T, the mother block B, and the file allocation table block FAT according to the respective erase counts thereof. Referring to FIG. 9, details of an exemplary method of the sorting operations are described as follows.

FIG. 9 illustrates a result of sorting operations that the method shown in FIG. 4 performs with respect to erase counts according to a second embodiment of the present invention, where this embodiment is a variation of the first embodiment, and the program code 112C is correspondingly replaced by a program code 112C', which is a varied version of the program code 112C. The block numbers of the blocks Fblk(2), Fblk(17), Fblk(300), Fblk(170), Fblk(712), Fblk(44), Fblk(12), Fblk(194), Fblk(602), . . . , etc. represent an exemplary sorted result, where the controller performs the sorting operations on the aforementioned blocks Fblk(0), Fblk(1), . . . , etc. according to the respective erase counts of the blocks in the spare regions to generate the sorted result. Please note that the order of the blocks in the sorted result is for illustrative purposes only, and is not meant to be a limitation of the present invention.

According to this embodiment, the aforementioned at least one threshold value comprises a plurality of threshold values, such as the M threshold values Th(1), Th(2), . . . , and Th(M), and the controller (more particularly, the memory controller 110 that executes the program code 112C' by utilizing the microprocessor 112) can sieve out the specific block according to the sorted result shown in FIG. 9 by utilizing the M threshold values. In practice, the controller can respectively compare matched positions in the sorted result shown in FIG. 9 according to the M threshold values, in order to divide the sorted result into (M+1) portions P(0), P(1), . . . , and P(M) respectively corresponding to the (M+1) spare regions SA(0), SA(1), . . . , and SA(M) mentioned above, where the (M+1) portions P(0), P(1), . . . , and P(M) respectively correspond to the aforementioned intervals [0, Th(1)), [Th(1), Th(2)), . . . , and [Th(M), Th$_{MAX}$]. Thus, by utilizing the sorting operations in this embodiment, the present invention can achieve the same objective (e.g. obtaining the same operation result of properly popping/sieving out a block for the purpose of use) as that achieved by classifying the blocks into the (M+1) spare regions.

In addition, as the (M+1) portions P(0), P(1), . . . , and P(M) of the sorted result respectively correspond to the (M+1) spare regions SA(0), SA(1), . . . , and SA(M) mentioned above, the above-disclosed block-sieving condition that there is no blank block available for popping/sieving out from the certain spare region SA(k) is replaced by a block-sieving condition that there is no blank block available for popping/sieving out from a certain portion P(k) in this embodiment. Similarly, when the block-sieving condition of this embodiment is satisfied (i.e. in a situation where there is no blank block available for popping/sieving out from the certain portion P(k)), the controller can sieve out a block from a portion adjacent to the portion P(k) (i.e. the previous portion P(k−1) or the next portion P(k+1)). In a situation where there is still no blank block available for popping/sieving out from the portions adjacent to the portion P(k), the controller can sieve out a block from a portion near the portion P(k) (e.g. a portion of the portions SA(k−2), SA(k−3), . . . , etc., or a portion of the portions SA(k+2), SA(k+3), . . . , etc.).

In another embodiment, the controller merely sorts the blocks of the spare regions according to their erase counts, rather than dividing a whole spare region into a plurality of sub-spare regions. In this embodiment, the sorted result is still the same as that shown in FIG. 9 with an order of increasing erase counts. When popping/sieving out the blocks from the spare regions, the controller pops/sieves according to a purpose of use. For example, when popping out a blank block as a child block is required, the controller sieves out a block having the greatest erase count (e.g. 8) as the child block. In another example, when popping out a blank block as a temporary block is required, the controller sieves out a block having the least erase count (e.g. 8) as the temporary block.

Additionally, in response to a situation where the frequency of erasure may varies for the blocks of various purposes of use (e.g. the mother blocks A and B, the child block C, the temporary block T, the file allocation table block FAT, and the new block B$_{NEW}$ as shown in FIGS. 5-8), the controller of this embodiment pops/sieves out blocks from different portions of the (M+1) portions respectively for different purposes of use, such as the purpose of "utilizing the sieved block as a mother/new block", the purpose of "utilizing the sieved block as a child block", the purpose of "utilizing the sieved block as a temporary block", the purpose of "utilizing the sieved block as a file allocation table block", etc. Similar descriptions for this embodiment are not repeated in detail.

Those skilled in the art will readily observe that numerous modifications and alterations of the device and method may be made while retaining the teachings of the invention.

What is claimed is:

1. A method of evenly using a plurality of blocks of a Flash memory, the method being applied to a controller positioned within a memory device, which comprises the Flash memory, the method comprising:

providing at least one threshold value, which is utilized for sieving out blocks suitable for use from the plurality of blocks according to erase counts of the plurality of blocks; and sieving out a specific block from the plurality of blocks according to a purpose of use, and according to whether continuous data is to be written into the specific block, by comparing erase counts of at least a portion of the plurality of blocks with the threshold value in order to use the specific block;

wherein the controller selects a first block, whose erase count is equal to a first value, from the plurality of blocks and then writes continuous data into the first block, wherein the first value is greater than a specific threshold value of the at least one threshold value; and the controller selects a second block, whose erase count is equal to a second value, from the plurality of blocks and then writes non-continuous data into the second block, wherein the second value is less than the specific threshold value of the at least one threshold value.

2. The method of claim 1, wherein the at least one threshold value comprises a plurality of threshold values.

3. The method of claim 1, wherein the step of sieving out the specific block from the plurality of blocks according to the purpose of use by comparing the erase counts of the portion of the plurality of blocks with the threshold value in order to use the specific block further comprises:

classifying at least a portion of the plurality of blocks by comparing erase counts of at least a portion of the plurality of blocks with the threshold value; and according to the purpose of use, determining a classification type from which the specific block should be sieved out for use.

4. The method of claim 3, wherein the step of classifying the portion of the plurality of blocks by comparing the erase counts of the portion of the plurality of blocks with the threshold value further comprises:

classifying at least a portion of the plurality of blocks into a first type and a second type, wherein erase counts of blocks of the first type are greater than erase counts of blocks of the second type.

5. The method of claim 1, wherein the step of sieving out the specific block from the plurality of blocks according to the purpose of use by comparing the erase counts of at least the portion of the plurality of blocks with the threshold value in order to use the specific block further comprises:
sorting at least a portion of the plurality of blocks by comparing erase counts of at least a portion of the plurality of blocks with the threshold value; and
according to the purpose of use, determining a sorted portion from which the specific block should be sieved out for use, wherein the sorted portion represents a portion of a sorted result.

6. The method of claim 1, wherein the step of sieving out the specific block from the plurality of blocks according to the purpose of use by comparing the erase counts of the portion of the plurality of blocks with the threshold value in order to use the specific block further comprises:
sieving out the specific block from the plurality of blocks according to the purpose of use by comparing erase counts of all of the plurality of blocks with the threshold value in order to use the specific block.

7. The method of claim 1, further comprising:
dynamically adjusting the threshold value.

8. The method of claim 1, wherein each of the plurality of blocks is a blank block.

9. The method of claim 1, wherein
when at least one sector of data in a specific page of a mother block, rather than all sectors of data in the specific page of the mother block, needs to be updated and the at least one sector of data does not comprise a last sector of the specific page, the controller selects the second block, whose erase count is equal to the second value, from the plurality of blocks and then writes both of updated data of the at least one sector and the other sectors of the specific page that are read from the mother block into the second block; and a data amount of the at least one sector of data is less than that of the specific page of the mother block.

10. A memory device, comprising:
a Flash memory comprising a plurality of blocks; and
a controller for accessing the Flash memory, wherein the controller is provided with at least one threshold value, in order to sieve out blocks suitable for use from the plurality of blocks according to erase counts of the plurality of blocks, wherein the controller sieves out a specific block from the plurality of blocks according to a purpose of use, and according to whether continuous data is to be written into the specific block, by comparing erase counts of at least a portion of the plurality of blocks with the threshold value in order to use the specific block;
wherein the controller selects a first block, whose erase count is equal to a first value, from the plurality of blocks and then writes continuous data into the first block, wherein the first value is greater than a specific threshold value of the at least one threshold value; and
the controller selects a second block, whose erase count is equal to a second value, from the plurality of blocks and then writes non-continuous data into the second block, wherein the second value is less than the specific threshold value of the at least one threshold value.

11. The memory device of claim 10, wherein the at least one threshold value comprises a plurality of threshold values.

12. The memory device of claim 10, wherein the controller classifies at least a portion of the plurality of blocks by comparing erase counts of at least a portion of the plurality of blocks with the threshold value; and according to the purpose of use, the controller determines a classification type from which the specific block should be sieved out for use.

13. The memory device of claim 12, wherein the controller classifies at least a portion of the plurality of blocks into a first type and a second type, wherein erase counts of blocks of the first type are greater than erase counts of blocks of the second type.

14. The memory device of claim 10, wherein the controller sorts at least a portion of the plurality of blocks by comparing erase counts of at least a portion of the plurality of blocks with the threshold value; and according to the purpose of use, the controller determines a sorted portion from which the specific block should be sieved out for use, wherein the sorted portion represents a portion of a sorted result.

15. The memory device of claim 10, wherein the controller sieves out the specific block from the plurality of blocks according to the purpose of use by comparing erase counts of all of the plurality of blocks with the threshold value in order to use the specific block.

16. The memory device of claim 10, wherein the controller dynamically adjusts the threshold value.

17. The memory device of claim 10, wherein each of the plurality of blocks is a blank block.

18. The memory device of claim 10, wherein
when at least one sector of data in a specific page of a mother block, rather than all sectors of data in the specific page of the mother block, needs to be updated and the at least one sector of data does not comprise a last sector of the specific page, the controller selects the second block, whose erase count is equal to the second value, from the plurality of blocks and then writes both of updated data of the at least one sector and the other sectors of the specific page that are read from the mother block into the second block; and a data amount of the at least one sector of data is less than that of the specific page of the mother block.

19. A controller of a memory device, the controller being utilized for accessing a Flash memory comprising a plurality of blocks, the controller comprising:
a read only memory (ROM) arranged to store a program code, wherein the controller is provided with at least one threshold value through the program code, in order to sieve out blocks suitable for use from the plurality of blocks according to erase counts of the plurality of blocks; and
a microprocessor arranged to execute the program code to control the access to the Flash memory, wherein the controller that executes the program code by utilizing the microprocessor sieves out a specific block from the plurality of blocks according to a purpose of use, and according to whether continuous data is to be written into the specific block, by comparing erase counts of at least a portion of the plurality of blocks with the threshold value in order to use the specific block;
wherein the controller selects a first block, whose erase count is equal to a first value, from the plurality of blocks and then writes continuous data into the first block, wherein the first value is greater than a specific threshold value of the at least one threshold value; and
the controller selects a second block, whose erase count is equal to a second value, from the plurality of blocks and then writes non-continuous data into the second block, wherein the second value is less than the specific threshold value of the at least one threshold value.

20. The controller of claim 19, wherein the at least one threshold value comprises a plurality of threshold values.

21. The controller of claim 19, wherein the controller that executes the program code by utilizing the microprocessor classifies at least a portion of the plurality of blocks by comparing erase counts of at least a portion of the plurality of blocks with the threshold value; and according to the purpose of use, the controller that executes the program code by utilizing the microprocessor determines a classification type from which the specific block should be sieved out for use.

22. The controller of claim 21, wherein the controller that executes the program code by utilizing the microprocessor classifies at least a portion of the plurality of blocks into a first type and a second type, wherein erase counts of blocks of the first type are greater than erase counts of blocks of the second type.

23. The controller of claim 19, wherein the controller that executes the program code by utilizing the microprocessor sorts at least a portion of the plurality of blocks by comparing erase counts of at least a portion of the plurality of blocks with the threshold value; and according to the purpose of use, the controller that executes the program code by utilizing the microprocessor determines a sorted portion from which the specific block should be sieved out for use, wherein the sorted portion represents a portion of a sorted result.

24. The controller of claim 19, wherein the controller that executes the program code by utilizing the microprocessor sieves out the specific block from the plurality of blocks according to the purpose of use by comparing erase counts of all of the plurality of blocks with the threshold value in order to use the specific block.

25. The controller of claim 19, wherein the controller that executes the program code by utilizing the microprocessor dynamically adjusts the threshold value.

26. The controller of claim 19, wherein each of the plurality of blocks is a blank block.

27. The controller of claim 19, wherein
when at least one sector of data in a specific page of a mother block, rather than all sectors of data in the specific page of the mother block, needs to be updated and the at least one sector of data does not comprise a last sector of the specific page, the controller selects the second block, whose erase count is equal to the second value, from the plurality of blocks and then writes both of updated data of the at least one sector and the other sectors of the specific page that are read from the mother block into the second block; and a data amount of the at least one sector of data is less than that of the specific page of the mother block.

28. A method of evenly using a plurality of blocks of a Flash memory, the method being applied to a controller positioned within a memory device, which comprises the Flash memory, the Flash memory being erased in units of blocks, the method comprising:

classifying the plurality of blocks into a data region or a spare region, wherein the blocks in the spare region are blank blocks;

recording at least one erase count of at least one block of the spare region; and popping a spare block from the spare region according to the recorded erase count and one of a plurality of purposes of use, and according to whether continuous data is to be written into the spare block, in order to use the spare block;

wherein the controller selects a first block, whose erase count is equal to a first value, from the spare region and then writes continuous data into the first block, wherein the first value is greater than a specific threshold value of the at least one threshold value; and the controller selects a second block, whose erase count is equal to a second value, from the spare region and then writes non-continuous data into the second block, wherein the second value is less than the specific threshold value of the at least one threshold value.

29. The method of claim 28, wherein the step of popping the spare block from the spare region according to the recorded erase count and one of the plurality of purposes of use in order to use the spare block further comprises:

classifying at least one block of the spare region according to the recorded erase count and at least one threshold value; and popping the spare block according to the purpose of use and a classified result in order to use the spare block.

30. The method of claim 28, wherein the step of popping the spare block from the spare region according to the recorded erase count and one of the plurality of purposes of use in order to use the spare block further comprises:

sorting a plurality of blocks of the spare region according to the recorded erase count and at least one threshold value; and popping the spare block from the spare region according to the purpose of use and a sorted result in order to use the spare block.

31. The method of claim 28, wherein the plurality of purposes of use comprises:

popping at least one block from the spare region as a temporary block, a file allocation table (FAT) block, a child block, or a new block for a purpose of writing.

32. The method of claim 28, wherein
when at least one sector of data in a specific page of a mother block, rather than all sectors of data in the specific page of the mother block, needs to be updated and the at least one sector of data does not comprise a last sector of the specific page, the controller selects the second block, whose erase count is equal to the second value, from the spare region and then writes both of updated data of the at least one sector and the other sectors of the specific page that are read from the mother block into the second block; and a data amount of the at least one sector of data is less than that of the specific page of the mother block.

* * * * *